(12) United States Patent
Brauer

(10) Patent No.: US 11,961,717 B2
(45) Date of Patent: Apr. 16, 2024

(54) PLASMA REACTORS

(71) Applicant: OZONE 1 PTY LTD, Nerang (AU)

(72) Inventor: John Lionel Brauer, Nerang (AU)

(73) Assignee: OZONE 1 PTY LTD, Nerang (AU)

( * ) Notice: Subject to any disclaimer, the term of this patent is extended or adjusted under 35 U.S.C. 154(b) by 296 days.

(21) Appl. No.: 17/415,898

(22) PCT Filed: Dec. 20, 2019

(86) PCT No.: PCT/AU2019/051417
§ 371 (c)(1),
(2) Date: Jun. 18, 2021

(87) PCT Pub. No.: WO2020/124158
PCT Pub. Date: Jun. 25, 2020

(65) Prior Publication Data
US 2022/0044915 A1    Feb. 10, 2022

(30) Foreign Application Priority Data

Dec. 21, 2018    (AU) ................ 2018904912

(51) Int. Cl.
*H01J 37/32*    (2006.01)
(52) U.S. Cl.
CPC .. *H01J 37/32541* (2013.01); *H01J 37/32568* (2013.01); *H01J 37/32577* (2013.01)
(58) Field of Classification Search
CPC ........... H01J 37/32541; H01J 37/32568; H01J 37/32577; C01B 13/11; H01T 19/04
See application file for complete search history.

(56) References Cited

U.S. PATENT DOCUMENTS 5,573,733 A    11/1996    Salama
5,665,165 A *  9/1997    Spencer ................ C23C 16/545
                                                              118/718
(Continued)

FOREIGN PATENT DOCUMENTS

AU    2011203168 A1    7/2011
CA       2075789 A1    2/1994
(Continued)

OTHER PUBLICATIONS

Extended European Search Report dated Jan. 4, 2022, in connection with European Patent Application No. 19900120.7, 10 pgs.
(Continued)

*Primary Examiner* — Tung X Le
(74) *Attorney, Agent, or Firm* — Chiesa Shahinian & Giantomasi PC

(57) ABSTRACT

An electrode for a plasma reactor, the electrode comprising an elongate body having an inlet end and an opposed outlet end, a reaction region extending along a portion of the elongate body, a first sealing region located between the reaction region and the inlet end of the elongate body and a second sealing region located between the reaction region and the outlet end of the elongate body, wherein the first sealing region and the second sealing region each comprise a plurality of receiving portions adapted to receive a sealing member therein, and wherein a barrier member adapted to reduce or eliminate the flow of fluid between the receiving portions provided between each of the plurality of receiving portions.

25 Claims, 8 Drawing Sheets

(56) References Cited

U.S. PATENT DOCUMENTS

| | | | |
|---|---|---|---|
| 5,897,795 A | 4/1999 | Lu et al. | |
| 6,583,428 B1* | 6/2003 | Chipman | H01J 37/3171 |
| | | | 250/492.21 |
| 2004/0031676 A1 | 2/2004 | Brauer et al. | |
| 2013/0256269 A1* | 10/2013 | Nikkhoo | B08B 7/0035 |
| | | | 134/1.1 |
| 2017/0155231 A1* | 6/2017 | Brauer | H01T 19/04 |
| 2018/0308666 A1* | 10/2018 | Collins | H01L 21/6831 |

FOREIGN PATENT DOCUMENTS

| | | |
|---|---|---|
| WO | 02/15350 A2 | 2/2002 |
| WO | 2016/000038 A1 | 1/2016 |

OTHER PUBLICATIONS

International Search Report and Written Opinion dated Mar. 25, 2020, in connection with International Patent Application No. PCT/AU2019/051417, filed Dec. 20, 2019, 12 pgs.

Supplementary European Search Report dated Feb. 19, 2018, in connection with European Patent Application No. 15815345.2, 10 pgs.

International Search Report and Written Opinion dated Aug. 26, 2015, in connection with International Patent Application No. PCT/AU2015/050368, filed Jul. 1, 2015, 8 pgs.

\* cited by examiner

PLASMA REACTORS

CROSS-REFERENCE TO RELATED APPLICATIONS

This application is a national stage under 35 U.S.C. 371 of International Patent Application No. PCT/AU2019/051417, filed Dec. 20, 2019, which claims priority to Australian Patent Application No. 2018904912, filed Dec. 21, 2018, the disclosures of which are incorporated herein by reference in their entirety.

TECHNICAL FIELD

The present invention relates to plasma reactors. In particular, the present invention relates to plasma reactors for the processing of materials in the gaseous phase by means of plasma discharges.

BACKGROUND ART

Plasma discharges occur in gaseous media when the localised electric field in the neighbourhood of a body exceeds the electrical breakdown voltage of the gaseous medium. Plasma reactors typically consist of a chamber having an inlet and an outlet for a gaseous medium, an axial inner electrode and a cylindrical outer electrode surrounding the inner electrode. The electrical discharge within such reactors consists of streamers extending from the inner electrode towards the outer electrode.

By breaking down the gaseous medium within the reactor, new gaseous species may be generated. These new gaseous species may be useful in their own right (such as the generation of ozone from oxygen or air) or may be used to convert harmful gases into less harmful species (such as the generation of carbon monoxide and hydrogen from greenhouse gases such as carbon dioxide and methane).

In some situations, acid may be produced as a product of the reaction within the reactor. In conventional plasma reactors, acid can damage seals, leading to a reduction in efficiency in the reactor as well as a shortened operational lifespan.

Thus, there would be an advantage if it were possible to provide a plasma reactor (or parts thereof) that could reduce or eliminate the effects of acid production on the efficiency of operation and operational lifespan of the reactor.

It will be clearly understood that, if a prior art publication is referred to herein, this reference does not constitute an admission that the publication forms part of the common general knowledge in the art in Australia or in any other country.

SUMMARY OF INVENTION

The present invention is directed to an electrode for a plasma reactor which may at least partially overcome at least one of the abovementioned disadvantages or provide the consumer with a useful or commercial choice.

In a first aspect, the present invention resides broadly in an electrode for a plasma reactor, the electrode comprising an elongate body having an inlet end and an opposed outlet end, a reaction region extending along a portion of the elongate body, a first sealing region located between the reaction region and the inlet end of the elongate body and a second sealing region located between the reaction region and the outlet end of the elongate body, wherein the first sealing region and the second sealing region each comprise a plurality of receiving portions adapted to receive a sealing member therein, and wherein a barrier member adapted to reduce or eliminate the flow of fluid between the receiving portions is provided between each of the plurality of receiving portions.

Preferably, the electrode comprises an inner electrode of a plasma reactor.

The elongate body may be of any suitable size, shape or configuration, and it will be understood that the dimensions of the elongate body may be scaled up or down depending on the duty to which the electrode is to be put. In a preferred embodiment of the invention, the elongate body may have a substantially circular cross-section along substantially its entire length. Thus, in this embodiment of the invention, the electrode may comprise a bar or rod. The inner electrode may be fabricated from any suitable material, although in a preferred embodiment of the invention the inner electrode may be fabricated from metal, such as, but not limited to, aluminium, iron, mild steel, stainless steel, copper, silver, gold, aluminium, platinum, titanium or any suitable metal alloy.

In a preferred embodiment, the electrode may comprise at least one bore extending along at least a portion of the length of the elongate body. Preferably the at least one bore extends from the inlet end of the electrode along at least a portion of the length of the electrode. The bore may extend to the outlet end of the electrode, or may terminate at a point between the inlet end and the outlet end of the electrode.

Alternatively, the electrode may include two bores. In this embodiment of the invention, a first bore (or inlet bore) may extend into the body from the inlet end thereof. A second bore (or outlet bore) may extend into the body from the outlet end thereof. Preferably, the combined length of the first bore and the second bore is less than the length of the elongate body. In this way, the first bore and the second bore do not meet. Thus, in this embodiment, the innermost ends of the bores may be separated from one another by a portion of the length of the elongate body.

The reaction region may be of any suitable size, shape or configuration, and it will be understood that the length of the reaction region may vary depending on the duty to which the electrode is to be put. Preferably, the reaction region comprises a portion of an outer surface of the elongate body.

The outer surface of the elongate body within the reaction region may be adapted to enhance the reaction that is to take place in the reaction region. In some embodiments of the invention, the surface of the elongate body in the reaction region may be substantially smooth. Alternatively, the surface of the elongate body in the reaction region may be textured in a manner to enhance the reaction to take place in the reaction region. For instance, the surface of the elongate body in the reaction region may be provided with one or more grooves, channels or the like. In other embodiments of the invention, the surface may be treated to provide a plurality of regions of elevated height. The regions of elevated height may be of any suitable form. For instance, the regions of elevated height may comprise a plurality of relatively large regions of elevated height. These relatively large regions may have a substantially planar surface or may have an uneven surface. More preferably, however, the regions of elevated height may comprise a plurality of peaks. In this embodiment, the plurality of peaks may be separated from one another by a plurality of troughs. In some embodiments of the invention, a combination of relatively large regions of elevated height and peaks may be provided. In a most preferred embodiment of the invention, the regions of elevated height comprise a plurality of relatively sharp peaks having a tip at the apex of the peak. The surface may be treated in any suitable way, such as by chemical treatment (acid treatment or the like) or through a mechanical process to remove material from the surface of the elongate body (such as sand-blasting, cutting, knurling or the like).

In some embodiments of the invention, at least the surface of the elongate body in the reaction region may be provided with a coating adapted to enhance the reaction to take place in the reaction region. In these embodiments of the invention, the coating may be a catalytic coating adapted to enhance the speed and/or efficiency of the reaction in the reaction region. Any suitable catalytic coating may be used, although in some embodiments of the invention, the catalytic coating may be a coating of a noble metal, such as (but not limited to) gold, silver, platinum and the like.

Other coating or plating materials, such as other metals (e.g. titanium), ceramics (e.g. titanium dioxide) or oxides (e.g. manganese dioxide), may also be used. Alternatively, at least the portion of the elongate body located in the reaction region may be fabricated from these materials.

In a preferred embodiment of the invention, opposed ends of the reaction region may be defined by a shoulder member. Preferably, the shoulder member may be adapted to reduce or eliminate the flow of fluid past the shoulder member. In particular, the shoulder member may be adapted to reduce or eliminate the flow of acid generated in the reaction region past the shoulder member. Thus, the shoulder member may reduce or eliminate the possibility of acid generated in the reaction region from coming into contact with the sealing regions and, more particularly, the sealing members. In some embodiments of the invention, the sealing members may be susceptible to damage or degradation when brought into contact with acid. In turn, degradation or damage to the sealing member may result in a reduction in the effectiveness of the seal (and a loss of pressure in the reaction region) formed between the sealing member and, for instance, a sleeve (such as a dielectric sleeve) in which the electrode is received during use.

The shoulder member may be of any suitable form. Preferably, however, the shoulder member may be formed integrally with the electrode. In a preferred embodiment of the invention, the shoulder member may extend outwardly from the surface of the elongate body to a sufficient height so as to prevent the flow of liquid thereover. Thus, the shoulder members at opposed ends of the reaction region may effectively act as bunds. In other embodiments, the shoulder member may extend outwardly from the surface of the elongate body to a height at which it is located adjacent, or in abutment with, a sleeve (such as a dielectric sleeve) in which the electrode is received during use. In this way, the shoulder members may reduce or eliminate the flow of liquids and/or gases from the reaction region to the sealing regions.

In a preferred embodiment of the invention, the shoulder members may extend outwardly from the elongate body in a substantially annular manner.

The shoulder members may be of any suitable shape. For instance, at least one of the shoulder members may be tapered. In this way, it may be easier to move a sealing member over the shoulder member and into a receiving portion. Alternatively, the shoulder members may be substantially square. This may assist in mounting the electrode to an objection, such as a bulkhead. This is particularly the case for the shoulder member located between the sealing regions and the respective ends of the electrode.

In some embodiments of the invention, an aperture may be provided in an outer surface of the elongate body at each end of the reaction region. It is envisaged that the apertures may be provided in order to drain fluid from the reaction region (including acid generated in the reaction region). The apertures may be of any suitable size and shape, although it is preferred that the apertures are of sufficient size and shape to be able to drain sufficient fluid from the reaction region in order to reduce or eliminate the build-up of fluid (particularly acidic fluid) in the reaction region.

Preferably, the apertures may be in fluid communication with the one or more bores in the elongate body. The apertures at each end may be in fluid communication with the same bore. More preferably, the aperture located at the inlet end of the reaction region (the inlet aperture) may be in fluid communication with the bore extending into the elongate body from the inlet end thereof, while the aperture located at the outlet end of the reaction region (the outlet aperture) may be in fluid communication with the bore extending into the elongate body from the outlet end thereof.

Thus, in this embodiment of the invention it is envisaged that the gaseous medium to be processed in the plasma reactor may enter the electrode through the bore located at the inlet end of the elongate body, and may pass through the inlet aperture into the reaction region. Reaction products generated in the reaction region may exit the reaction region through the outlet aperture and then exit the electrode through the bore located at the outlet end of the elongate body. It will be understood that the reaction products may include any species produced during the reaction within the reaction region, and may include gaseous or liquid species. In addition, it is possible that a portion of the gaseous medium entering the reaction region may not react. As a result, unreacted gaseous medium may also exit the reaction region through the outlet aperture.

Any suitable number of inlet apertures and outlet apertures may be provided. For instance, a single inlet aperture and a single outlet aperture may be provided. More preferably at least a pair of inlet apertures and at least a pair of outlet apertures may be provided. In a specific embodiment of the invention, the electrode may be provided with four inlet apertures and 4 outlet apertures. In some embodiments, the inlet apertures and/or the outlet apertures may be spaced equidistantly from one another about the circumference of the electrode.

The bores may extend beyond the apertures any suitable distance toward the opposed end of the electrode, and the length of the bore is not critical to the invention. In some embodiments of the invention, the bores may extend only a relatively short distance toward the opposed end of the electrode beyond the apertures. In this embodiment, it is envisaged that the likelihood of stagnant gas accumulating in the bore may be reduced. In addition, cooling of the electrode may be improved due to increased air exchange.

On the other hand, providing bores that extend a relatively long distance toward the opposed end of the electrode beyond the apertures may also provide some advantages. For instance, longer bores reduces the amount of material (and therefore the weight) in the electrode, potentially reducing shipping costs. Reduced thermal mass may also aid in cooling of the electrode.

In a preferred embodiment of the invention, a first of the pair of bores may be relatively short, while a second of the pair of bores may be relatively long. In this embodiment of the invention, the relatively short bore may extend into the electrode from the inlet end of the electrode, while the relatively long bore may extend into the electrode from the outlet end thereof.

It is envisaged that, by providing the relatively short bore at the inlet end of the electrode, a reduced area for stagnant fluid to accumulate may be provided. In this way, the temperature of the fluid entering the reaction region through the inlet aperture may be prevented from rising too high. If the temperature of the fluid rises too high, unwanted chemical reactions may occur before the fluid enters the reaction region, therefore making the reaction in the reaction region less efficient.

It is further envisaged that, by providing the relatively long bore at the outlet end of the electrode, the thermal mass of the electrode may be reduced, and heat generated in the reaction region may be removed by fluid exiting the reaction region through the outlet apertures.

In some embodiments, a plurality of inlet apertures and/or a plurality of outlet apertures may be provided.

Preferably, each of the inlet apertures and the outlet apertures may be located so as to pass through at least a portion of the shoulder member located at the respective ends of the reaction region. It is envisaged that the amount of fluid that enters the sealing regions may be reduced or eliminated by locating the apertures so that they pass through at least a portion of the shoulder member. This is because there is no gap between the apertures and the shoulder members in which fluid can build up and not be removed from the reaction region through the apertures.

In some embodiments of the invention one or more intermediate outlet apertures may be provided in the reaction region spaced apart from both the first sealing region and the second sealing region. In this embodiment of the invention, the one or more intermediate outlet apertures within the reaction region may be adapted to provide an escape route for fluid that has already reacted or been heated. This may not only improve the efficiency of the electrode, but may also assist in avoiding secondary reactions of already reacted fluid within the reaction region (and an associated breakdown of reaction product, or reduced production of reaction product).

The one or more intermediate outlet apertures in the reaction region may be positioned at any suitable distance from the first sealing region and the second sealing region. For instance, the one or more intermediate outlet apertures may be located approximately equidistant from each of the first sealing region and the second sealing region. More preferably, however, the one or more intermediate outlet apertures in the reaction region may be located closer to the outlet end of the electrode than the inlet end thereof. In a specific embodiment of the invention, the one or more intermediate outlet apertures in the reaction region may be located approximately one third of the length of the reaction region from the second sealing region (and therefore approximately two thirds of the length of the reaction region from the first sealing region).

In some embodiments of the invention, a plurality of intermediate outlet apertures may be provided at different points within the reaction region. Preferably, however, all of the intermediate outlet apertures may be located in the portion of the reaction region comprising approximately one third of the length of the reaction region from the second sealing region.

It is envisaged that a plurality of intermediate outlet apertures may be provided in situations in which relatively high flow of fluid entering the device is anticipated. In situations of relatively high flow, reaction product may be drawn out of the plurality of intermediate outlet apertures such that the volume of fluid flowing through the outlet apertures at the end of the reaction region is approximately the same as in relatively low flow situations.

It is envisaged that fluid exiting the reaction region through the one or more intermediate outlet apertures may draw fluid from within the outlet bore towards the outlet of the electrode. This may assist in ensuring the temperature of the electrode is kept relatively low.

The intermediate outlet apertures may be of any suitable diameter. In a preferred embodiment of the invention, the diameter of the intermediate outlet apertures is smaller than the diameter of the outlet apertures. In a specific embodiment of the invention, the diameter of the intermediate outlet apertures may be between approximately 1.5 mm and 2 mm, although it will be understood that the diameter may vary depending on the size of the electrode, the diameter of the inlet apertures and/or the outlet apertures, the flow of fluid through the reaction region, the nature of the reaction in the reaction region and so on.

It is envisaged that, by removing reaction product from the reaction region through the one or more intermediate outlet apertures, the overall production of reaction product may be increased. It is envisaged that the reason for this may be, at least in part, that removing reaction product from the reaction region through the one or more intermediate outlet apertures may reduce the likelihood of secondary reactions that convert the desired reaction product into other chemical species.

In some embodiments of the invention, the reaction region may be provided with one or more channels. In a preferred embodiment of the invention, a channel may be located adjacent the first sealing region and/or the second sealing region. In a particular embodiment, a channel may be located adjacent a shoulder member at both ends of the reaction region. Preferably, at least a portion of each of the apertures is located within one of the one or more channels. Preferably, the one or more channels are substantially annular.

The one or more channels may be of any suitable form. Preferably, however, the diameter of the elongate body in the region of the one or more channels is lower than the diameter of the elongate body in the remainder of the reaction region. In this way, the fluid in the reaction region may flow into the one or more channels and be drained more effectively and/or completely. Preferably, the one or more channels extend annularly about the circumference of the elongate body.

As previously stated, the electrode comprises a first sealing region located between the reaction region and the inlet end of the elongate body, and a second sealing region located between the reaction region and the outlet end of the elongate body. The sealing regions may be of any suitable form, and may provide any suitable seal. Preferably, however, the sealing regions may be adapted to provide a seal between the electrode and a sleeve (such as a dielectric sleeve) in which the electrode is received during use.

In some embodiments of the invention, one or more sealing members may be integrally formed with the sealing regions. Alternatively, one or more sealing members may be formed separately to the sealing regions and may be adapted for fixed or removable connection thereto.

The one or more sealing members may be of any suitable form. Preferably, the one or more sealing members are fabricated from a resiliently deformable material. In this way, the sealing members may deform when brought into contact with an object (such as a sleeve, including a dielectric sleeve, in which the electrode is received during use), thereby forming a seal. By providing a sealing region at either end of the reaction region and forming a seal with the sealing regions, a desired atmosphere and/or pressure may be maintained within the reaction region.

Any suitable resiliently deformable material may be used, such as rubber or a polymeric material. In some embodiments of the invention the resiliently deformable material may have acid resistant properties. In a preferred embodiment of the invention, the one or more sealing members may comprise O-rings, gaskets or the like.

The receiving portions may be of any suitable form. Preferably, however, the receiving portions may be of sufficient width to accommodate at least one sealing member therein. More preferably, each receiving portion is adapted to receive a single sealing member therein. Any suitable number of receiving portions may be provided. In a specific embodiment of the invention, at least three receiving portions are provided, wherein each of the at least three receiving portions are adapted to receive a sealing member.

In a preferred embodiment of the invention, the receiving portions may have a smaller diameter than both the shoulder members and the barrier members. Thus, when a sealing member is received in a receiving portion, it is envisaged that the sealing member may extend radially outwardly from the receiving portion to a point substantially equal to, or slightly above) the point to which the shoulder members and the barrier members extend radially from the elongate body.

The barrier members may be of any suitable form. As previously stated, the barrier members are adapted to reduce or eliminate the flow of fluid between the receiving portions. In particular, the barrier members may be adapted to reduce or eliminate the flow of acid generated in the reaction region past the barrier members. Thus, the barrier members may reduce or eliminate the possibility of acid generated in the reaction region from coming into contact with the sealing members. In some embodiments of the invention, the sealing members may be susceptible to damage or degradation when brought into contact with acid. In turn, degradation or damage to the sealing member may result in a reduction in the effectiveness of the seal (and a loss of pressure in the reaction region) formed between the sealing member and, for instance, a sleeve (such as a dielectric sleeve) in which the electrode is received during use.

The barrier members may be of any suitable form. Preferably, however, the barrier members may be formed integrally with the electrode. In a preferred embodiment of the invention, the barrier members may extend outwardly from the surface of the elongate body to a sufficient height so as to prevent the flow of liquid thereover. Thus, even if fluid, and particularly liquid acid, is able to flow past the shoulder member and enter a receiving portion adjacent the barrier members, a barrier member between adjacent receiving portions will substantially preclude the flow of fluid from one receiving portion to another. In other embodiments, the barrier members may extend outwardly from the surface of the elongate body to a height at which they are located adjacent, or in abutment with, a sleeve (such as a dielectric sleeve) in which the electrode is received during use. In this way, the barrier members may reduce or eliminate the flow of liquids and/or gases from the reaction region to adjacent receiving portions. Preferably, the barrier members all extend outwardly from the surface of the elongate body to substantially the same height. Preferably, the barrier members extend outwardly from the surface of the elongate body to substantially the same height as the shoulder members.

In other embodiments of the invention, the barrier members may extend outwardly from the surface of the elongate body to a height less than the height of the shoulder members. In this embodiment of the invention, the barrier members may in effect form a saddle. This may assist in locating the sealing members in the receiving portions.

In a preferred embodiment of the invention, the receiving portion located furthest from the reaction region in both the first sealing region and the second sealing region may be provided with a barrier member on both sides thereof. Similarly, it is envisaged that the receiving portion located closest to the reaction region in both the first sealing region and the second sealing region may be provided with a barrier member on one side and the shoulder member on the other. In this way, each receiving portion is provided with a barrier member and/or shoulder member on each side thereof.

The shoulder member positioned between the reaction region and the first sealing region and/or the shoulder member positioned between the reaction region and the second sealing region may be of any suitable width. For instance, the shoulder members may be of the same width as the barrier members. More preferably, the shoulder members may be of greater width than the barrier members. By providing a relatively wide shoulder member between the reaction region and the first sealing region and/or between the reaction region and the second sealing region, the flow of fluid between the reaction region and the first sealing region and/or the second sealing region may be further reduced and/or eliminated. In addition, by providing a relatively wide shoulder member, pressure on the sealing member located adjacent the shoulder member may be reduced.

As previously stated, the shoulder portion may extend outwardly from the surface of the electrode (and, more specifically, from the surface of the electrode in the reaction region). The shoulder portion may extend outwardly from the surface of the electrode at any suitable angle to the surface of the electrode. For instance, the shoulder portion may extend outwardly from the surface of the electrode at an angle of approximately 90° to the surface of the electrode. More preferably, the shoulder portion may extend outwardly from the surface of the electrode at an angle of between approximately 45° and 85° to the surface of the electrode. Still more preferably, the shoulder portion may extend outwardly from the surface of the electrode at an angle of approximately 55° and 85° to the surface of the electrode. Yet more preferably, the shoulder portion may extend outwardly from the surface of the electrode at an angle of between approximately 65° and 85° to the surface of the electrode. Most preferably, the shoulder portion may extend outwardly from the surface of the electrode at an angle of approximately 75° to the surface of the electrode.

The shoulder portion may be disposed at the same angle to the surface of the electrode about at least a portion of the circumference of the electrode. In some embodiments of the invention, the shoulder portion may be disposed at the same angle to the surface of the electrode about the entire circumference of the electrode.

Preferably, an inlet connection portion may be provided between the first sealing region and the inlet end of the elongate body. Similarly, an outlet connection portion may be provided between the second sealing region and the outlet end of the elongate body. The connection portions may be of any suitable form, although it is preferred that the connection portions may be adapted to allow the connection of the electrode to another object, such as a valve, conduit (hose, tube, pipe etc.) or the like. The connection portions may include one or more clamps, clasps, snap fittings, hooks, or the like, or any suitable combination thereof. More preferably, the connection portions may be adapted for connection to a complementary connection portion provided on the object to which the electrode is to be connected. For instance, the connection portions may comprise screw-threaded portions or the like. The screw-threaded portions may be provided on an inner surface of the bores. More preferably, the screw-threaded portions may be provided on an outer surface of the electrode. The inlet connection portion and the outlet connection portion may be of the same length, or may be of different lengths. In a preferred embodiment of the invention, the inlet connection portion is of a shorter length than the outlet connection portion.

In some embodiments of the invention, a capping member may be provided on one or both ends of the electrode. The capping member may be of any suitable form, although it is envisaged that the capping member may be located adjacent to, or in abutment with, an end of the or each sealing region. In a preferred embodiment of the invention, the capping member may include a flange member extending substantially parallel to the elongate body. In this embodiment it is envisaged that the flange member may be adapted to overlie a portion of a sleeve (such as a dielectric sleeve) in which the electrode is received during use. The flange member may frictionally engage with an outer surface of the sleeve or may be adhered thereto, using an adhesive such as silicone, to enhance the seal between the electrode and the sleeve.

It is envisaged that the capping member may be connected to the connection portion using any suitable technique. Preferably, however, the capping member may include an internal screw-threaded portion adapted to screw-threadedly engage with the screw-threaded connection portion.

In a second aspect, the present invention resides broadly in a plasma reactor including an inner electrode comprising the electrode of the first aspect.

In a third aspect, the invention resides broadly in an electrode for a plasma reactor, the electrode comprising an elongate body having an inlet end and an opposed outlet end, a reaction region extending along a portion of the elongate body, a first bore extending into the elongate body from the inlet along a portion of the length of the elongate body, and a second bore extending into the elongate body from the outlet end along a portion of the length of the elongate body, wherein each opposed end of the reaction region is defined by a shoulder member adapted to substantially preclude the flow of fluid past the shoulder member, the electrode further comprising an inlet aperture is provided in the elongate body at an inlet end of the reaction region, the inlet aperture being in fluid communication with the first bore, and an outlet aperture in the elongate body at an outlet end of the reaction region, the outlet aperture being in fluid communication with the second bore, and wherein the apertures are located so as to pass through at least a portion of the shoulder member located at the respective end of the reaction region.

In a preferred embodiment of the invention, the electrode further comprises a first sealing region located between the reaction region and the inlet end of the elongate body and a second sealing region located between the reaction region and the outlet end of the elongate body, wherein the first sealing region and the second sealing region each comprise a plurality of receiving portions adapted to receive a sealing member therein, and wherein a barrier member adapted to reduce or eliminate the flow of fluid between the receiving portions is provided between each of the plurality of receiving portions.

In a fourth aspect, the invention resides broadly in a plasma reactor including an inner electrode comprising the electrode of the third aspect.

In a fifth aspect, the invention resides broadly in a plasma reactor assembly, the assembly comprising one or more plasma reactors in fluid communication with a source of fluid to be reacted in the one or more plasma reactors, the assembly further comprising an electrical current generation portion adapted to generate an electrical current to drive a reaction in the one or more plasma reactors, and wherein the assembly further comprises one or more valves adapted to reduce or eliminate fluid flow into or out of the assembly.

Preferably, the one or more plasma reactors may comprise the plasma reactors of the second or fourth aspects.

The source of fluid may be of any suitable form. For instance, the source of fluid may be a fluid generator, pressure vessel (such as a gas bottle or the like) or the like. Alternatively, the source of fluid may be a main line, and the assembly or, more specifically, the one or more plasma reactors may be plumbed into the main line.

The electrical current generation portion may be of any suitable form. It will be understood that the size and configuration of the electrical current generation portion may be dependent on the size of the electrical current to be generated, and the purpose for which the electrical current is to be used. For instance, different size electrical currents may be required to drive different reactions within the plasma reactors. Similarly, different size electrical currents may be required when multiple plasma reactors are present compared to when a single plasma reactor is present.

The electrical current generation portion may include an electrical power source (such as a battery, photovoltaic cell or the like), or may be electrically associated with an external electrical power source (such as a generator, mains power, or the like). In general, however, the electrical current generation portion is conventional, and no specific discussion of this is required.

Preferably, the electrical current generation portion may be electrically connected to an outer electrode of the one or more plasma reactors.

In embodiments of the invention in which a plurality of plasma reactors are present, it is envisaged that the plasma reactors may be positioned in series with one another.

In an alternative embodiment of the invention, a plurality of plasma reactors may be positioned in parallel with one another. It is envisaged that this arrangement may be desirable in situations where high fluid flowrate is encountered, whereby the fluid flow may be divided between the plurality of plasma reactors in parallel with one another. The fluid flow may be divided using any suitable technique. For instance, a manifold, one or more valves or the like, or any suitable combination thereof, may be provided to divide the fluid flow between the plurality of plasma reactors.

In embodiments of the invention in which a plurality of plasma reactors are present in the plasma reactor assembly, it is envisaged that a plurality of electrical power sources may be used. The electrical power sources may be the same as one another, or may be different to one another.

In this embodiment of the invention, one or more plasma reactors may be associated with each electrical power source. For instance, two or more electrical power sources may be provided, wherein at least one of the electrical power sources is electrically associated with two or more plasma reactors. In a particular embodiment, each plasma reactor may be associated with its own individual electrical power source.

It is envisaged that the plasma reactor assembly may include an inlet and an outlet. The inlet may be an inlet of a plasma reactor. Preferably, the inlet of the assembly is in fluid communication with the source of fluid to be reacted.

The outlet may be of any suitable form, although in some embodiments of the invention, the outlet may comprise an outlet of a plasma reactor. More preferably, the outlet of the plasma reactor may be connected to a conduit (such as a pipe, hose or the like). In this embodiment of the invention, the outlet of the conduit may comprise the outlet of the assembly.

In embodiments of the invention in which a conduit extends between the plasma reactor and the outlet of the assembly, it is envisaged that the one or more valves may be associated with the conduit. Preferably, the valve includes a valve member adapted to move between a closed condition (in which the flow of fluid through the valve is substantially precluded) and an open condition (in which there is no impediment to the flow of fluid through the valve). The valve may be of any suitable form, although in a preferred embodiment of the invention, the valve may comprise a solenoid valve.

In embodiments of the invention in which the valve comprises a solenoid valve, the valve may be electrically associated with the same electrical power source as the electrical current generation portion.

It is envisaged that, when fluid is flowing through the assembly (i.e. when the plasma reactors are operating) the valve may be in the open condition. However, when no fluid is flowing through the assembly (i.e. when the plasma reactors are not operating) the valve may be in the closed condition. Actuation of the valve may be achieved using any suitable manner. For instance, the vale may be actuated manually. More preferably, the valve may be actuated automatically. Most preferably, the valve may be actuated automatically in response to the flow of fluid through the assembly. For instance, when fluid begins to flow through the assembly, the valve may actuate and move to the open condition. When the flow of fluid through the assembly ceases, the valve may actuate and move to the closed condition.

It is envisaged that, in the closed condition, the assembly may be substantially isolated and/or sealed. In this way the flow of fluid through the outlet of the assembly into the plasma reactors may be reduced or eliminated. It will be understood that the backflow of fluid into the assembly in this manner may damage the plasma reactors and/or the assembly as a whole.

Similarly, leakage from the assembly through the outlet may be reduced or eliminated. This may reduce or eliminate the accidental or unwanted discharge of reaction product (such as ozone) through the outlet of the assembly.

In some embodiments of the invention, the assembly may further comprise a mounting portion to which the parts of the assembly may be mounted. The mounting portion may be of any suitable form, although in some embodiments of the invention, the mounting portion may comprise a bracket.

The sleeve in which the electrode is received may be of any suitable form. Preferably, however, the sleeve may comprise a dielectric sleeve. The sleeve may be fabricated from any suitable material, although in a preferred embodiment of the invention the sleeve may comprise a glass tube in which the electrode is received.

Preferably, an outer electrode may be associated with the sleeve. The outer electrode may be of any suitable form. However, it is preferred that the outer electrode may be at least partially fabricated from an electrically conductive material (such as, but not limited to, metal, metal alloys or the like). In some embodiments, a conductive sleeve (such as a metal sleeve) may be provided. It is envisaged that the conductive sleeve may at least partially surround at least a portion of the dielectric sleeve.

In other embodiments of the invention, a layer of electrically conductive material may be provided on the outer surface of the dielectric sleeve. The layer of electrically conductive material may at least partially surround at least a portion of the dielectric sleeve. The electrically conductive material may be of any suitable type, although in a preferred embodiment of the invention, the electrically conductive material may be a metal, metal alloy or the like. In this embodiment of the invention, the layer of electrically conductive material may form at least a portion of the outer electrode.

The layer of electrically conductive material may be applied to the outer surface of the dielectric sleeve using any suitable technique. For instance, the layer may be painted onto the dielectric sleeve or may be applied using any suitable technique, such as, but not limited to, chemical or physical vapour deposition processes (including Magnetron sputtering), chemical and electrochemical techniques (including electroplating), spraying, roll-to-roll coating processes and/or physical coating processes.

In this embodiment of the invention, the electrical connection to the outer electrode (i.e. the layer of electrically conductive material) may be enhanced by providing an electrical connection member. Any suitable electrical connection member may be provided, although in some embodiments of the invention, the electrical connection member may be provided to at least partially surround the region of the dielectric sleeve to which the layer of electrically conductive material has been applied. The electrical connection member is preferably fabricated from an electrically conductive material, such as metal or metal alloy.

In some embodiments of the invention, the electrical connection member may comprise one or more coils of electrically conductive material, such as coiled metal wire or a metal spring. In this embodiment, it is envisaged that the one or more coils of electrically conductive material may surround the dielectric sleeve along at least a portion of the length of the dielectric sleeve.

It is envisaged that the one or more coils of electrically conductive material may form the outer surface of the plasma reactor. Alternatively, a layer, and in particular an insulating layer, may be provided over the one or more coils of electrically conductive material. The insulating layer may be of any suitable form, although in a preferred embodiment of the invention the insulating layer may be fabricated from a polymeric material. In a preferred embodiment of the invention, the insulating layer may comprise a heat shrink.

Any of the features described herein can be combined in any combination with any one or more of the other features described herein within the scope of the invention.

The reference to any prior art in this specification is not, and should not be taken as an acknowledgement or any form of suggestion that the prior art forms part of the common general knowledge.

BRIEF DESCRIPTION OF DRAWINGS

Preferred features, embodiments and variations of the invention may be discerned from the following Detailed Description which provides sufficient information for those skilled in the art to perform the invention. The Detailed Description is not to be regarded as limiting the scope of the preceding Summary of the Invention in any way. The Detailed Description will make reference to a number of drawings as follows.

DESCRIPTION OF EMBODIMENTS

Figure 1:
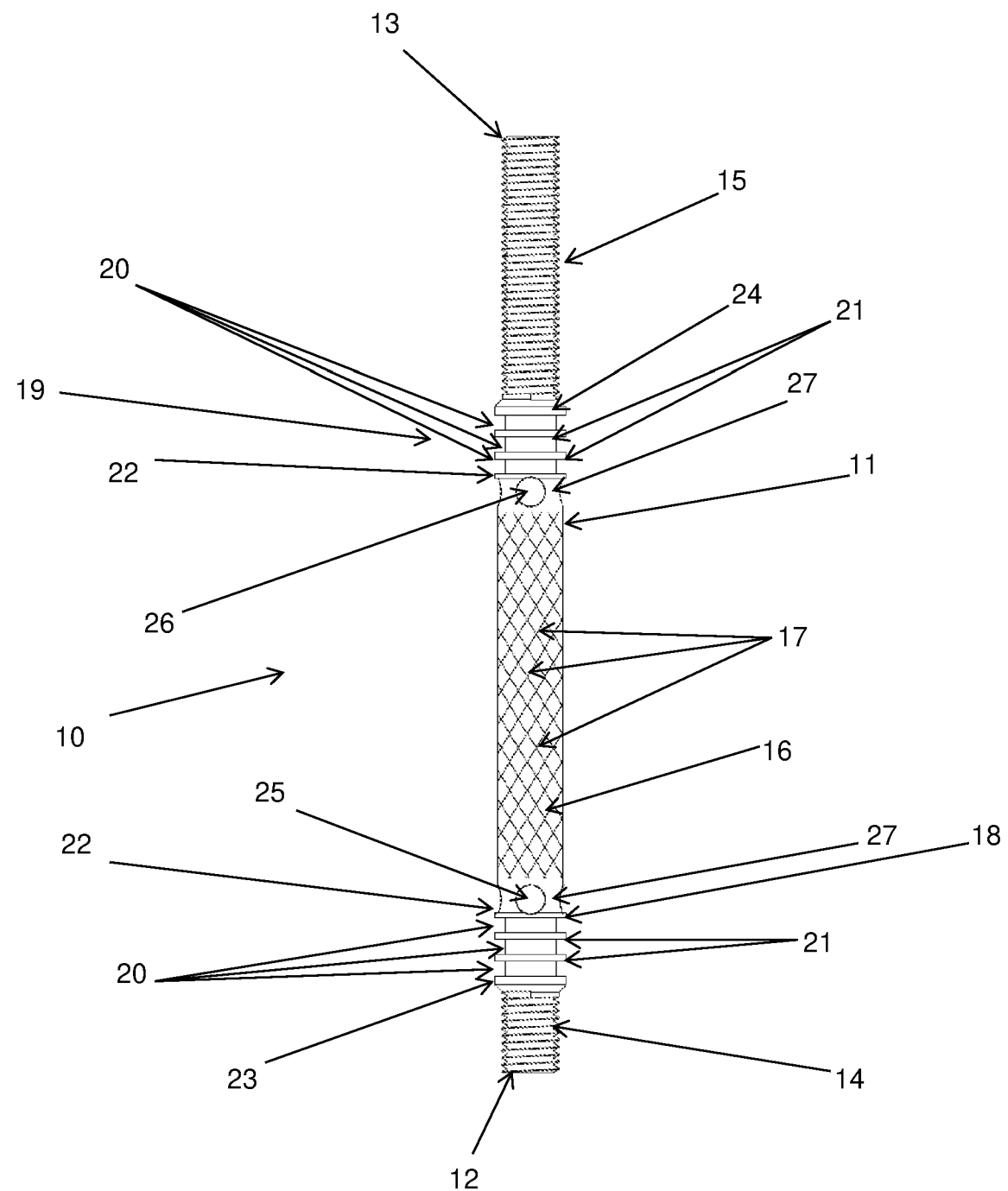
FIG. 1 illustrates a side view of an electrode for a plasma reactor according to an embodiment of the present invention.

FIG. 1 illustrates a side view of an electrode 10 for a plasma reactor according to an embodiment of the present invention. The electrode 10 comprises an elongate body 11 having an inlet end 12 and an opposed outlet end 13. Both the inlet end 12 and the outlet end 13 of the elongate body 11 are provided with external screw-threaded connection portions 14, 15 adapted to allow screw-threaded connection of the electrode 10 to a conduit (not shown), such as a pipe, hose or the like. In particular, the external screw-threaded connection portions 14, 15 are adapted for screw-threaded connection to an internal screw-threaded portion of a conduit, or a connector etc.

The electrode 10 comprises a reaction region 16. In the embodiment of the invention shown in FIG. 1, the outer surface of the electrode 10 in the reaction region 16 is knurled so as to create regions of elevated height 17 in the surface of the reaction region 16.

A first sealing region 18 is provided between the reaction region 16 and the inlet end 12 of the electrode 10, while a second sealing region 19 is provided between the reaction region 16 and the outlet end 13 of the electrode 10. Each of the first sealing region 18 and the second sealing region 19 is provided with three receiving portions 20 therein adapted to receive a sealing member (not shown), typically in the form of an O-ring. Each receiving portion 20 is in the form of an annular channel that extends about the circumference of the electrode 10. Each receiving portion 20 is separated from adjacent sealing regions 20 by a barrier member 21. The barrier members 21 extend radially outwardly from the electrode 10 and are adapted to prevent the flow of fluid from the reaction region 16 between adjacent receiving portions 20.

In FIG. 1, opposed ends of the reaction region 16 are defined by a shoulder member 22. A shoulder member 22 is positioned between the reaction region 16 and each of the first sealing region 18 and the second sealing region 19. The purpose of the shoulder members 22 is to reduce or eliminate the flow of fluid from the reaction region 16 into the sealing regions 18, 19. This is particularly the case when acid is generated by the reaction in the reaction region 16. If acid were allowed to flow into the sealing regions 18, 19 it would come into contact with the sealing members (not shown) and would potentially degrade the sealing members (not shown). Degradation of the sealing members (not shown) will in turn lead to a reduction in the effectiveness of the seal between the sealing members (now shown) and the dielectric sleeve (not shown) that overlies the electrode 10 during use. This results in reduced operating efficiency of the plasma reactor of which the electrode 10 forms a part.

In FIG. 1, a shoulder member 23 is located at the end of the first sealing region 18 closest to the inlet end 12 of the electrode. Similarly, a shoulder member 24 is located at the end of the second sealing region 19 closest to the outlet end 13 of the electrode 10. Although the sealing members (not shown) form the seal between the electrode and the dielectric sleeve (not shown), it is envisaged that the shoulder members 22, 23, 24 and the barrier members 21 may extend outwardly from the surface of the electrode 10 to be in abutment with, or close proximity to, the inner surface of the dielectric sleeve (not shown). Thus, the shoulder members 22, 23, 24 and the barrier members 21 may also form a seal against the inner surface of the dielectric sleeve (not shown) or may be located in such close proximity thereto that the flow of liquid past the shoulder members 22, 23, 24 and the barrier members 21 is reduced or even precluded.

The reaction region 16 is provided with a plurality of inlet apertures 25 and a plurality of outlet apertures 26. In the embodiment of the invention illustrated in FIG. 1, the inlet apertures 25 allow fluid flowing along an inlet bore (obscured) that extends into the electrode 10 from the inlet end 12 thereof to enter the reaction region 16. Conversely, the outlet apertures 26 allow fluid to enter an outlet bore (obscured) that extends into the electrode 10 from the outlet end 13 thereof. Thus, fluid is removed from the reaction region 16 through the exit apertures 26. The fluid that leaves the reaction region 16 through the exit apertures 26 may be gaseous or liquid reactions products generated in the reaction region 16, may be an unreacted portion of the fluid that entered the reaction region 16 through the inlet apertures 25, or may be a combination thereof.

Although it is envisaged that the desired reaction product generated by the reaction in the reaction region 16 will exit through the outlet apertures 26, it is also envisaged that in applications in which reaction products such as acid and the like are generated in the reaction region, the inlet apertures 25 and/or the outlet apertures 26 may effectively act as drains through which reaction products may be removed to ensure that the reaction products are unable to come into contact with the sealing members (not shown).

To assist in ensuring that adequate drainage of the reaction products is achieved, both the inlet apertures 25 and the outlet apertures 26 pass through a portion of the respective shoulder members 22. In this way, no gap in which fluid is able to build up (and potentially overflow the shoulder members 22 into the sealing regions 18, 19) is present between the apertures 25, 26 and the respective shoulder members 22.

In the embodiments of the invention illustrated in FIG. 1, at least a portion of each of the inlet apertures 25 and the outlet apertures 26 are located within channels 27 that extend about the circumference of the electrode 10. The diameter of the electrode 10 in the region of the channels 27 is smaller than the diameter of the electrode 10 in the remainder of the reaction region 16. Thus, fluid generated in the reaction region 16 is directed to flow into the channels 27 and is subsequently removed from the reaction region 16 through the inlet apertures 25 and/or the outlet apertures 26.

Figure 2:
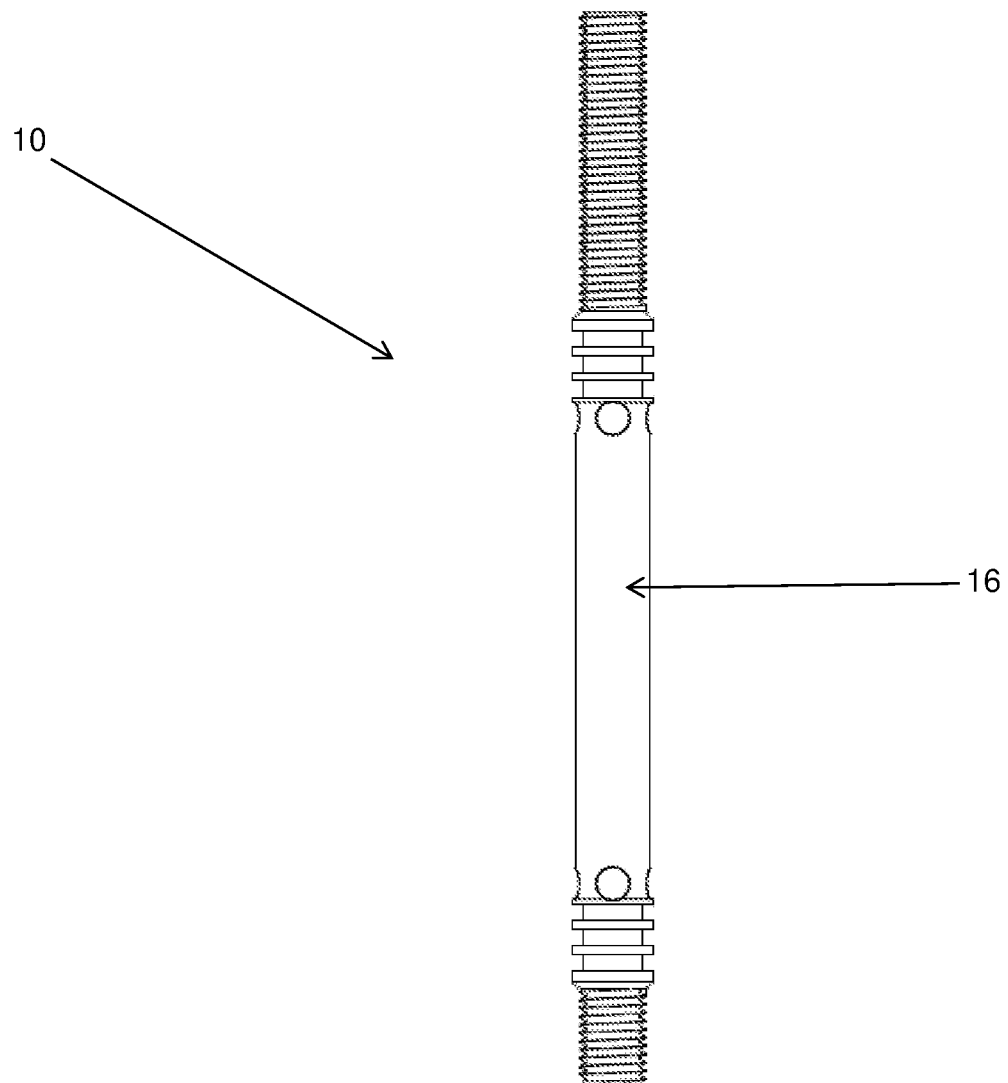
FIG. 2 illustrates a side view of an electrode for a plasma reactor according to an embodiment of the present invention.

FIG. 2 illustrates a side view of an electrode 10 for a plasma reactor according to an embodiment of the present invention. The electrode 10 illustrated in FIG. 2 is essentially identical to that illustrated in FIG. 1, with the exception that the surface of the electrode 10 in the reaction region 16 is smooth.

Figure 3:
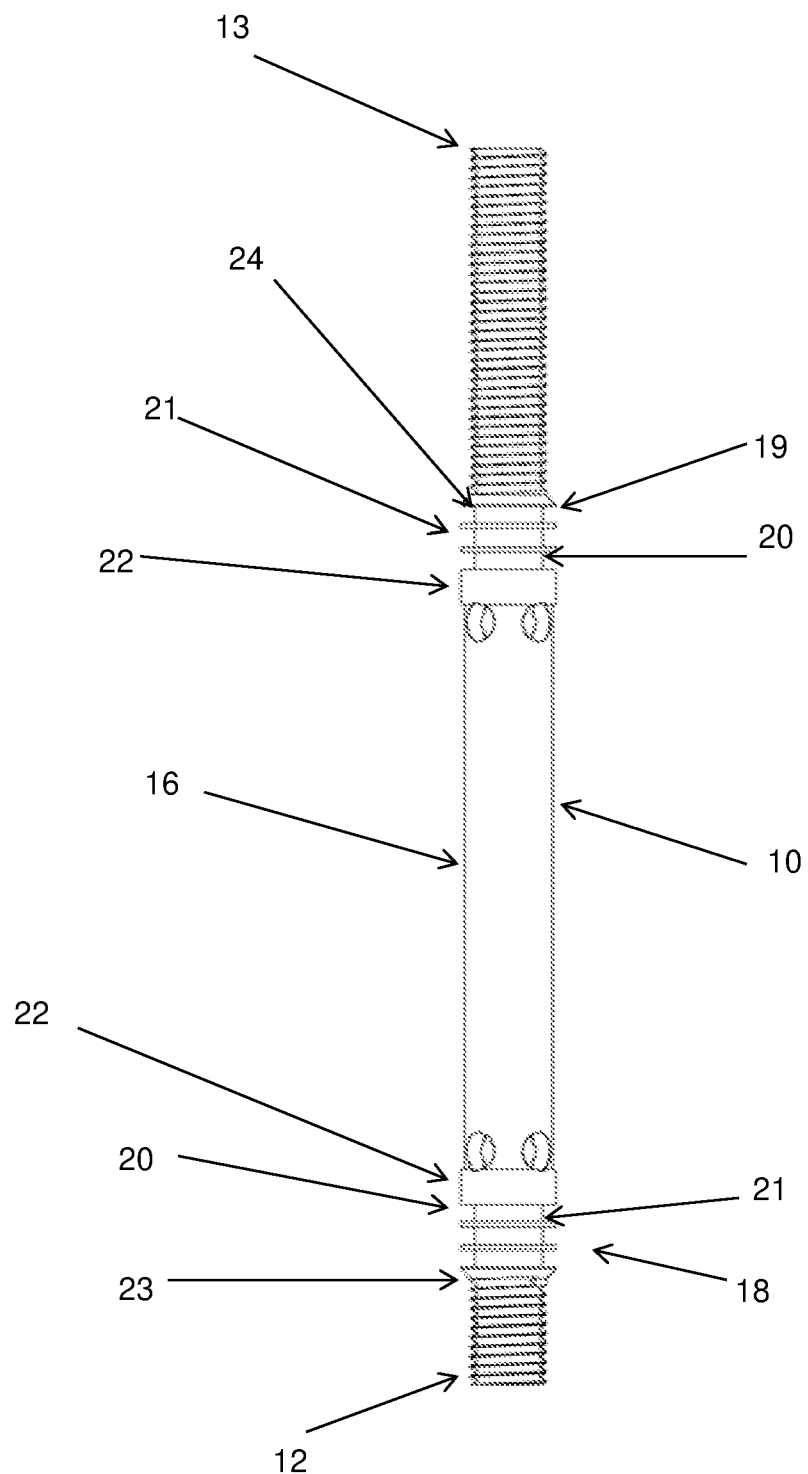
FIG. 3 illustrates a side view of an electrode for a plasma reactor according to an embodiment of the present invention.

FIG. 3 illustrates a side view of an electrode 10 for a plasma reactor according to an embodiment of the present invention. The electrode 10 illustrated in FIG. 3 is essentially identical to that illustrated in FIG. 2, with the exception that the shoulder member 22 positioned between the reaction region 16 and the first sealing region 18 and the shoulder member 22 positioned between the reaction region 16 and the second sealing region 19 are relatively wide (wider than the barrier members 21, for instance). In this way, the likelihood of fluid flowing from the reaction region 16 past the shoulder members 22 and into the first sealing region 18 or second sealing region 19 is reduced or eliminated. This arrangement also reduces pressure on the sealing member (not shown) in the receiving portion 20 adjacent each shoulder member 22.

In the embodiment of the invention shown in FIG. 3, the shoulder members 23, 24 between the sealing regions 18, 19 and the ends 12, 13 of the electrode 10 are shown with a tapered shape. It is envisaged that this shape may make locating sealing members (not shown) within the channels 20 easier.

However, in other embodiments of the invention, the shoulder members 23, 24 may be substantially square in order to assist in mounting the electrode 10 to a bulkhead (not shown).

It is envisaged that, when assembling a plasma reactor using the electrode 10 of FIG. 3, a quantity of sealant may be provided on the or each shoulder member 22. Any suitable sealant may be used, such as, but not limited to silicone. When the electrode is inserted into a dielectric sleeve (not shown), the sealant on the shoulder portion(s) 22 may be pushed or spread across the shoulder member 22 so as to assist in forming a seal between the shoulder member 22 and the dielectric sleeve (not shown). In some embodiments, the sealant may be pushed or spread into the receiving portion 20 adjacent the or each shoulder member 22 to form a physical barrier to reduce or preclude fluid (such as acid) from the reaction region 16 reaching a sealing member (not shown) positioned in the receiving portion 20. Not only does this ensure that a more effective seal is formed between the electrode 10 and the dielectric sleeve (not shown), but it also assists in extending the operational life of the electrode 10 and the plasma reactor by extending the life of the sealing member (not shown) by restricting degradation of the sealing member (not shown) by acid generated in the reaction region 16.

Figure 4:
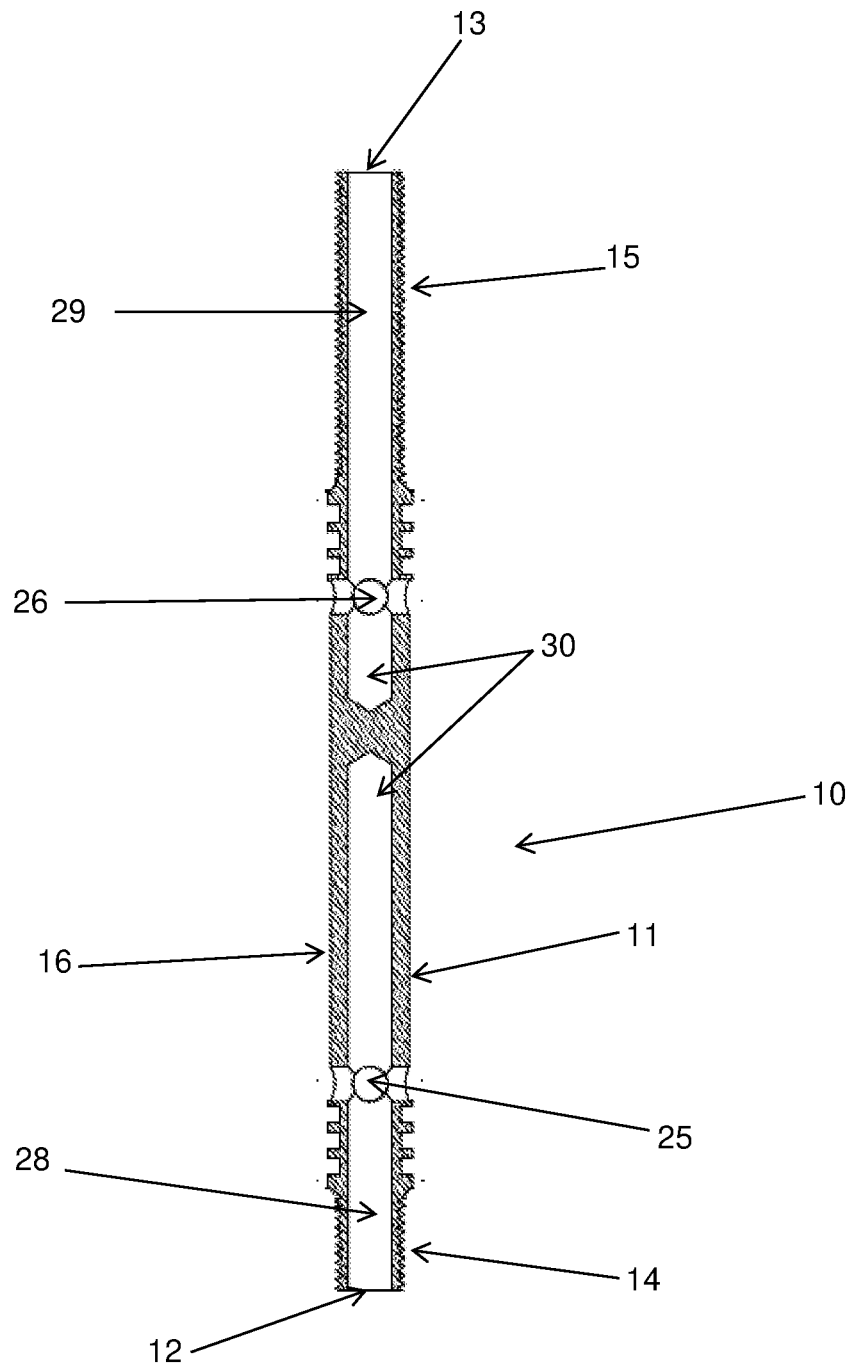
FIG. 4 illustrates a cross-sectional view of an electrode for a plasma reactor according to an embodiment of the present invention.

In FIG. 4 there is illustrated a cross-sectional view of an electrode 10 for a plasma reactor according to an embodiment of the present invention. The electrode 10 may be the electrode of either FIG. 1 or FIG. 2. The electrode 10 comprises an elongate body 11 having an inlet end 12 and an opposed outlet end 13. Both the inlet end 12 and the outlet end 13 of the elongate body 11 are provided with external screw-threaded connection portions 14, 15 adapted to allow screw-threaded connection of the electrode 10 to a conduit (not shown), such as a pipe, hose or the like.

In this Figure, it may be clearly seen that the electrode 10 comprises an inlet bore 28 that extends into the body 11 from the inlet end 12 and an outlet bore 29 that extends into the body 11 from the outlet end 13. In use, fluid enters the inlet end 12 of the electrode, travels along the inlet bore 28 and enters the reaction region 16 through a plurality of inlet apertures 25. Fluid leaving the reaction region 16 passes through a plurality of exit apertures 26 into the outlet bore 29 before leaving the electrode 10 through the outlet end 13.

It is clearly illustrated in FIG. 4 that the inlet bore 28 and the outlet bore 29 do not meet. However, each of the inlet bore 28 and the outlet bore 29 extend into body beyond the inlet aperture 25 and the outlet aperture 26, respectively. Thus, the inlet bore 28 and the outlet bore 29 each include reservoir portions 30 in which fluid generated in the reaction region 16, such as acid, may be collected.

Figure 5:
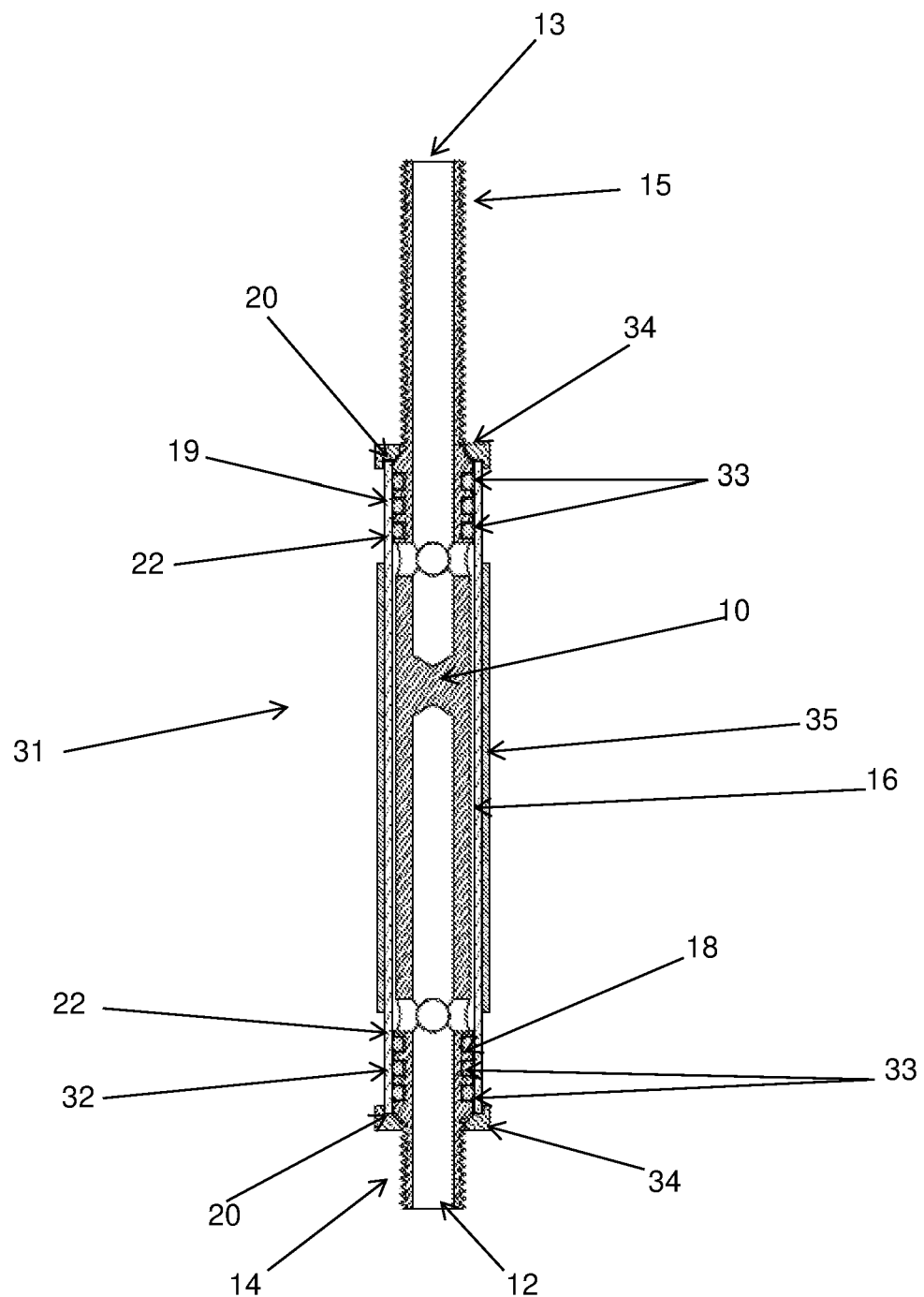
FIG. 5 illustrates a cross-sectional view of a plasma reactor according to an embodiment of the present invention.

In FIG. 5 there is illustrated a cross-sectional view of a plasma reactor 31 according to an embodiment of the present invention. The plasma reactor 31 includes an inner electrode 10 similar or identical to the ones illustrated in FIGS. 1 to 4 and 7 to 8. The inner electrode 10 is inserted into a dielectric sleeve 32, and a seal is formed between the inner electrode 10 and the dielectric sleeve 32 via O-rings 33 positioned in the receiving portions 20 of the first sealing region 18 and the second sealing region 19.

The seal formed between the O-rings 33 and the dielectric sleeve 32 substantially precludes fluid from escaping from the reaction region 16 (formed between the outer surface of the inner electrode 10 and the inner surface of the dielectric sleeve 32) between the O-rings 33 and the dielectric sleeve 32. The seal also maintains the pressure within the reaction region 16. Further, the use of multiple O-rings 33 serves to improve the ability to locate the inner electrode 10 substantially centrally within the dielectric sleeve 32. Typically, O-rings 33 do not have a completely consistent cross-sectional diameter or deformability due to unavoidable intolerances during manufacture. Therefore, the use of a single O-ring 33, or even a pair of O-rings 33 may result in the inner electrode 10 and the dielectric sleeve 32 not being positioned co-axially within one another.

In situations in which the inner electrode 10 is off-centre within the dielectric sleeve 32 (i.e. not positioned substantially co-axially within the dielectric sleeve 32), a portion of the inner electrode 10 will be positioned closer to the dielectric sleeve 32 than other parts of the electrode 10. This not only reduces the effectiveness of the reactor 31, but is also likely to reduce the service life of the reactor 31 due to the formation of hot spots that will degrade the inner electrode 10 and/or dielectric sleeve 32. The applicants have found that the use of 3 or more O-rings 33 overcomes the effect of the manufacturing intolerances so that the inner electrode 10 may be located substantially centrally within the dielectric sleeve 32.

In the embodiment of the invention shown in FIG. 5, the dielectric sleeve 32 is fabricated from glass.

The seal is enhanced through the use of capping members 34 provided at each end of the reactor 31. The capping members 34 are adapted for screw-threaded engagement with the screw threaded portions 14, 15 located at the inlet end 12 and the outlet end 13, respectively, of the inner electrode 10. The capping members 34 are adapted to overlie a portion of the dielectric sleeve 32 such that fluid is substantially precluded from escaping therebetween.

As can be seen in FIG. 5, an O-ring 33 is positioned in each of the receiving portions 20 of the first sealing region 18 and the second sealing region 19. This serves a number of purposes. Firstly, the presence of (in this instance) three O-rings 33 at each end of the reaction region 16 provides an enhanced seal against the dielectric sleeve 32. As O-rings 33 are not perfectly circular, using at least 3 O-rings 33 ensures that adequate sealing is formed between the O-rings 33 and the dielectric sleeve 32. In addition, while fluid such as acid should be substantially precluded from flowing out of the reaction region 16 past the shoulder portions 22 and into the sealing regions 18, 19 locating each O-ring 33 in a separate receiving portion 20 means that any acid that does reach the sealing regions 18, 19 will only reach the O-ring 33 closest to the shoulder portions 22. Thus, any adverse effect on the seal formed between the O-rings 33 and the dielectric sleeve 32 may be minimised.

The inner electrode 10 and dielectric sleeve 32 are inserted into an outer electrode 35 to complete the assembly of the plasma reactor 31

Figure 6:
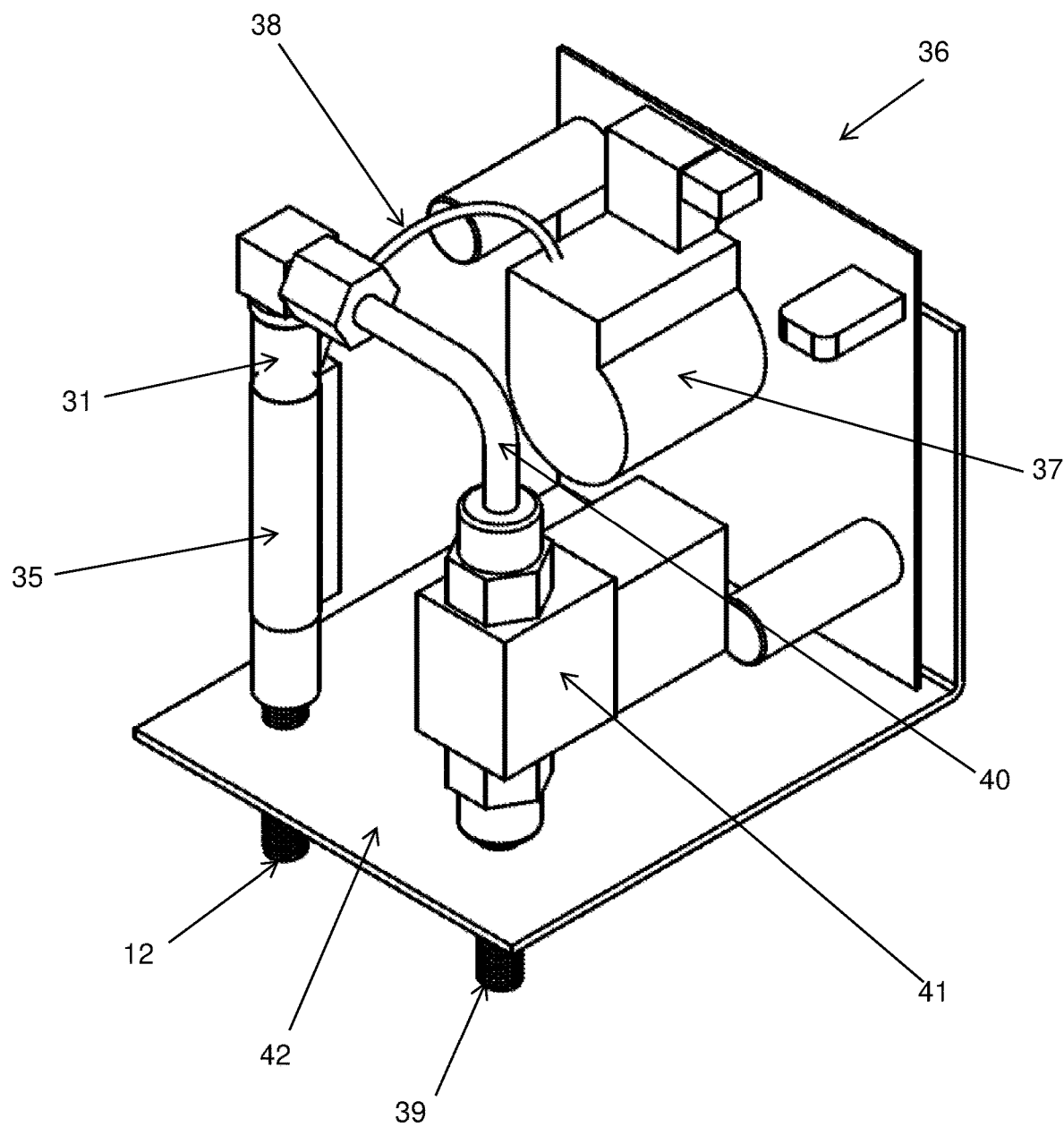
FIG. 6 illustrates an isometric view of a reaction assembly including a plasma reactor according to an embodiment of the present invention.

In FIG. 6 there is illustrated an isometric view of a plasma reactor assembly 36 according to an embodiment of the invention. The plasma reactor assembly 36 includes a plasma reactor 31 of the kind illustrated in FIG. 5.

The inlet end 12 of the plasma reactor 31 forms the inlet of the assembly 36 and is in fluid communication with a source of the fluid to be reacted (not shown). An electrical current generation portion 37 is electrically connected to the plasma reactor 31 (and, more specifically, to the outer electrode 35 of the plasma reactor 31) via wire 38. The electrical current generated by the electrical current generation portion 37 is used to drive the reaction (i.e. a plasma reaction, corona discharge reaction or the like) within the plasma generator 31.

The plasma generator 31 and the outlet 39 of the assembly are in fluid communication with one another via conduit 40. A solenoid valve 41 is located on conduit 40 between the plasma reactor 31 and the outlet 39. When fluid is flowing through the assembly 36, the solenoid valve 41 is in the open condition, such that fluid to be reacted may enter the assembly 36 through the inlet 12 and reaction products may exit the assembly 36 through the outlet 39. However, when the plasma reactor 31 is not operating and/or when fluid is not flowing into the assembly 36 through the inlet 12, the solenoid valve 41 may actuate to move into the closed condition in which fluid is substantially precluded from flowing between the plasma reactor 31 and the outlet 39 past the solenoid valve 41.

When the solenoid valve 1 is in the closed condition, fluid (such as water) downstream of the outlet 39 is substantially precluded from backflow into the assembly 36 through the outlet 39. In this way, the plasma reactor 31 may be protected from the backflow of fluid, which could lead to damage to, or at least the poor performance of, the plasma reactor 31.

The assembly 36 further comprises a mounting bracket 42 to which the parts of the assembly 36 are mounted.

Figure 7:
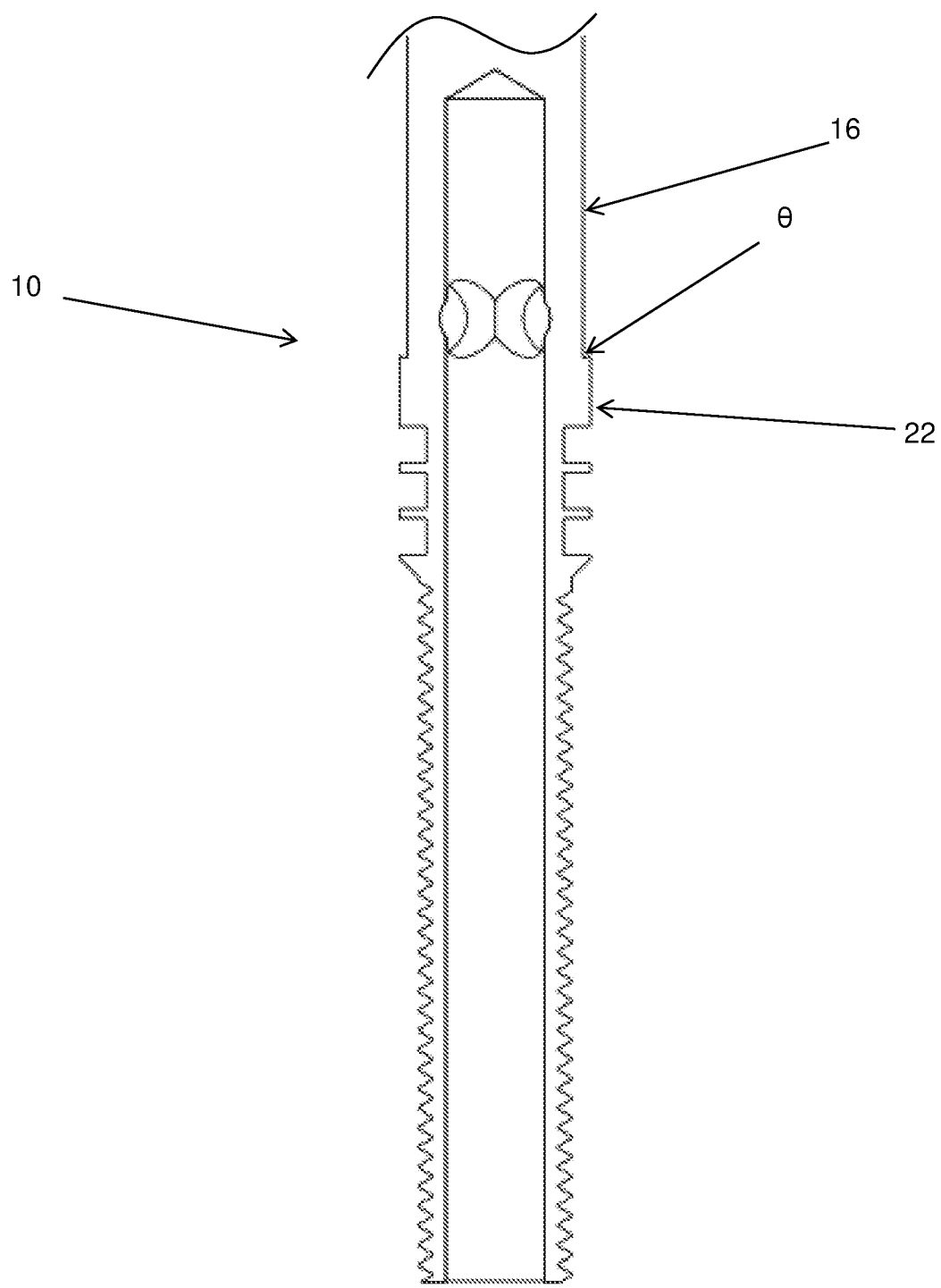
FIG. 7 illustrates a detailed cross-sectional view of an electrode for a plasma reactor according to an embodiment of the present invention.

In FIG. 7 there is illustrated a detailed cross-sectional view of an electrode 10 for a plasma reactor according to an embodiment of the present invention. In this embodiment, the angle θ between the surface of the electrode 10 in the reaction region 16 and the shoulder portion 22 may be more clearly seen. In this embodiment, the shoulder portion 22 extends outwardly from the surface of the electrode 10 in the reaction region 16 at an included angle θ of approximately 75° to the surface of the electrode 10 in the reaction region 16.

Figure 8:
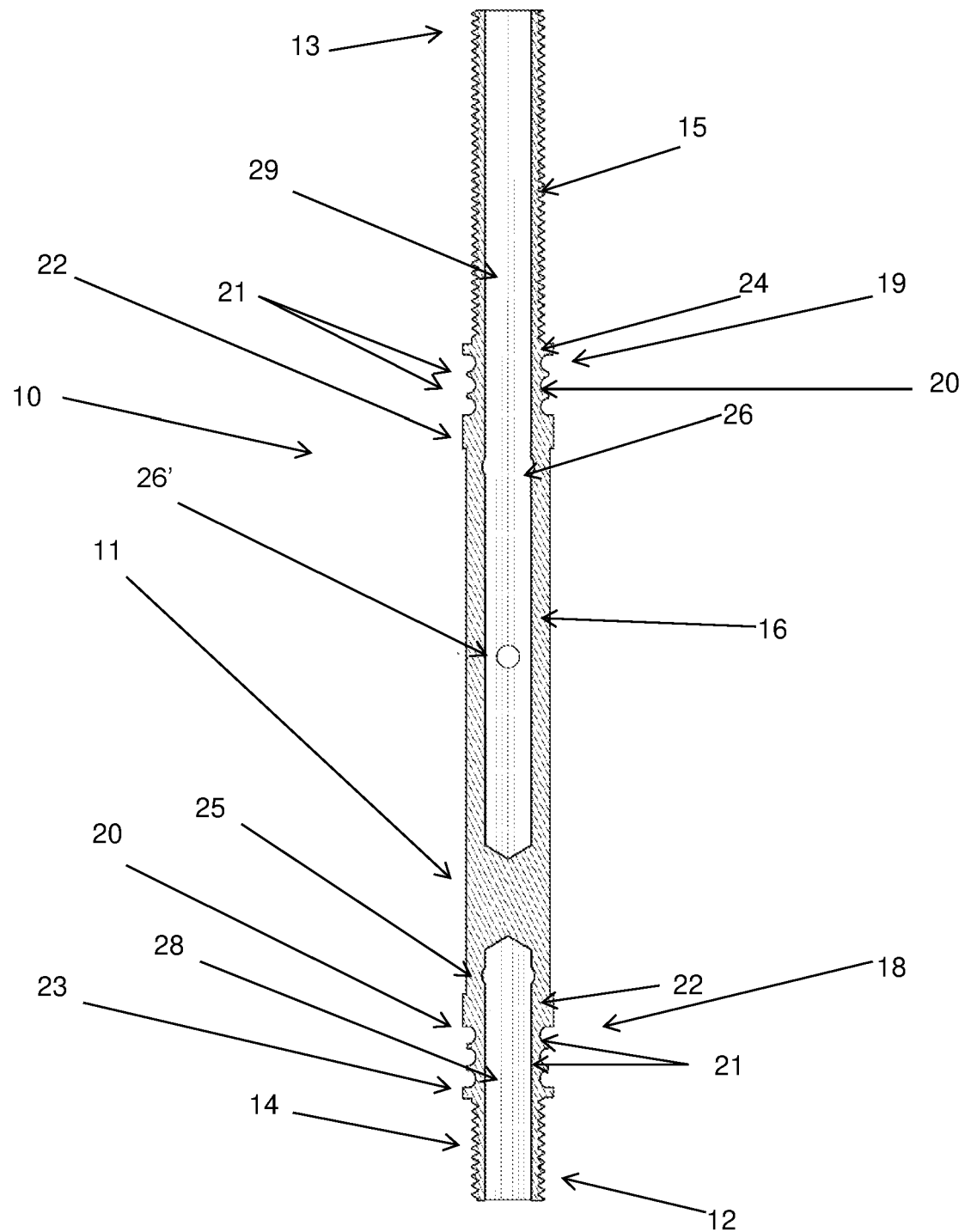
FIG. 8 illustrates a cross-sectional view of an electrode for a plasma reactor according to an embodiment of the present invention.

In FIG. 8 there is illustrated a cross-sectional view of an electrode 10 according to an embodiment of the present invention. The electrode 10 comprises an elongate body 11 having an inlet end 12 and an opposed outlet end 13. Both the inlet end 12 and the outlet end 13 of the elongate body 11 are provided with external screw-threaded connection portions 14, 15 adapted to allow screw-threaded connection of the electrode 10 to a conduit (not shown), such as a pipe, hose or the like.

In this Figure, it may be clearly seen that the electrode 10 comprises an inlet bore 28 that extends into the body 11 from the inlet end 12 and an outlet bore 29 that extends into the body 11 from the outlet end 13. In use, fluid enters the inlet end 12 of the electrode, travels along the inlet bore 28 and enters the reaction region 16 through a plurality of inlet apertures 25. Fluid leaving the reaction region 16 passes through a plurality of exit apertures 26 into the outlet bore 29 before leaving the electrode 10 through the outlet end 13.

It is clearly illustrated in FIG. 4 that the inlet bore 28 and the outlet bore 29 do not meet. However, the inlet bore 28 is relatively short, extending into the electrode to a point only just beyond the inlet apertures 25 (of which there are four in this embodiment). By providing a relatively short inlet bore 28, the ability to stagnant fluid to accumulate in the inlet bore 28 is reduced or eliminated. Further, fluid entering the electrode 10 through the inlet end 12 is substantially precluded from heating up prior to entering the reaction region 16 through the inlet apertures 25.

In contrast, the outlet bore 29 is relatively long, and extends into the electrode 10 a considerable distance beyond the outlet apertures 26 (of which there are four in this embodiment). Providing a relatively long outlet bore 29 not only reduces the mass of the electrode 10, but also assists in extracting heat from the reaction region 16 in reacted fluid.

It will be noted that, in FIG. 8, an intermediate outlet aperture 26' is located within the reaction region 16. The intermediate outlet aperture 26' is located approximately two thirds of the length of the reaction region 16 from the inlet apertures 25 and approximately a third of the length of the reaction region 16 from the outlet apertures 26. The intermediate outlet aperture 26' is located in the reaction region 16 so as to provide an outlet for reacted and/or heated fluid from the reaction region 16. By providing an intermediate outlet aperture 26' for reacted and/or heated fluid from the reaction region 16 between the inlet apertures 25 and the outlet apertures 26, secondary reactions of the already reacted fluid may be reduced or eliminated, thereby improving the efficiency of the electrode 10 in terms of increasing the quantity of desired reaction product produced.

In FIG. 8, the shoulder members 22 between the sealing regions 18, 19 and the reaction region 16 are relatively wide so as to reduce or eliminate the flow of fluid from the reaction region 16 into the sealing regions 18, 19 past the shoulder members 22. In addition, all shoulder members 22, 23, 24 are substantially square. In the case of shoulder members 23, 24, this may assist in mounting the electrode 10 to a bulkhead (not shown).

The barrier members 21 of FIG. 8 differ from the barrier members shown in other Figures in that they extend outwardly from the surface of the electrode 10 to a height less than that of the shoulder members 22, 23, 24. Thus, in this embodiment of the invention, the barrier members 21 form a saddle. This may assist in locating the sealing members (not shown) in the receiving portions 20.

In the present specification and claims (if any), the word 'comprising' and its derivatives including 'comprises' and 'comprise' include each of the stated integers but does not exclude the inclusion of one or more further integers.

Reference throughout this specification to 'one embodiment' or 'an embodiment' means that a particular feature, structure, or characteristic described in connection with the embodiment is included in at least one embodiment of the present invention. Thus, the appearance of the phrases 'in one embodiment' or 'in an embodiment' in various places throughout this specification are not necessarily all referring to the same embodiment. Furthermore, the particular features, structures, or characteristics may be combined in any suitable manner in one or more combinations.

In compliance with the statute, the invention has been described in language more or less specific to structural or methodical features. It is to be understood that the invention is not limited to specific features shown or described since the means herein described comprises preferred forms of putting the invention into effect. The invention is, therefore, claimed in any of its forms or modifications within the proper scope of the appended claims (if any) appropriately interpreted by those skilled in the art.

The invention claimed is:

1. An electrode for a plasma reactor, the electrode comprising:
    an elongate body having an inlet end and an opposed outlet end;
    a reaction region extending along a portion of the elongate body;
    a first sealing region located between the reaction region and the inlet end of the elongate body; and
    a second sealing region located between the reaction region and the outlet end of the elongate body, wherein the first sealing region and the second sealing region each comprise a plurality of receiving portions adapted to receive a sealing member therein, wherein each of the plurality of receiving portions in the first sealing region is separated from one another by a barrier member and each of the plurality of receiving portions in the second sealing region is separated from one another by a barrier member such that adjacent sealing members are spaced apart from one another by the barrier member, and wherein the barrier member is adapted to reduce or eliminate a flow of fluid between the receiving portions.

2. The electrode according to claim 1 wherein the reaction region comprises a portion of an outer surface of the elongate body.

3. The electrode according to claim 2 wherein the outer surface of the elongate body in the reaction region is adapted to enhance the reaction that is to take place in the reaction region.

4. The electrode according to claim 1 wherein opposed ends of the reaction region are defined by a shoulder member adapted to reduce or eliminate the flow of fluid past the shoulder member.

5. The electrode according to claim 4 wherein the shoulder members extend outwardly from the elongate body in a substantially annular manner.

6. The electrode according to claim 4 wherein the shoulder members extend outwardly from the elongate body at an angle of between approximately 55° and 85° to the surface of the electrode.

7. The electrode according to claim 1 wherein an inlet aperture is provided in an outer surface of the elongate body at an inlet end of the reaction region and an outlet aperture is provided in the outer surface of the elongate body at an outlet end of the reaction region.

8. The electrode according to claim 7 wherein the electrode comprises a first bore that extends into the body from the inlet end thereof and a second bore that extends into the body from the outlet end thereof.

9. The electrode according to claim 8 wherein the inlet aperture is in fluid communication with the first bore and the outlet aperture is in fluid communication with the second bore.

10. The electrode according to claim 7 wherein fluid enters the reaction region through the inlet aperture and exits the reaction region through the outlet aperture.

11. The electrode according to claim 7 when dependent on claim 4 wherein the inlet aperture and the outlet aperture pass through at least a portion of a shoulder member located at the respective end of the reaction region.

12. The electrode according to claim 7 wherein the electrode comprises a plurality of inlet apertures and a plurality of outlet apertures.

13. The electrode according to claim 1 wherein one or more intermediate outlet apertures are provided in the reaction region spaced apart from both the first sealing region and the second sealing region.

14. The electrode according to claim 1 wherein the reaction region is provided with an annular channel adjacent the first sealing region and/or the second sealing region.

15. The electrode according to claim 1 wherein the sealing members are fabricated from a resiliently deformable material.

16. The electrode according to claim 1 wherein each receiving portion is adapted to receive a single sealing member therein.

17. The electrode according to claim 1 wherein the first sealing region and the second sealing region each comprise at least three receiving portions.

18. The electrode according to claim 1 wherein an inlet connection portion is provided between the first sealing region and the inlet end of the elongate body.

19. The electrode according to claim 1 wherein an outlet connection portion is provided between the second sealing region and the outlet end of the elongate body.

20. A plasma reactor including an inner electrode, wherein the inner electrode comprises the electrode according to claim 1.

21. A plasma reactor assembly, the assembly comprising one or more plasma reactors as claimed in claim 20 in fluid communication with a source of fluid to be reacted in the one or more plasma reactors, the assembly further comprising an electrical current generation portion adapted to generate an electrical current to drive a reaction in the one or more plasma reactors, and wherein the assembly further comprises one or more valves adapted to reduce or eliminate fluid flow into or out of the assembly.

22. An electrode for a plasma reactor, the electrode comprising:
    an elongate body having an inlet end and an opposed outlet end,
    a reaction region extending along a portion of the elongate body,
    a first bore extending into the elongate body from the inlet end along a portion of the length of the elongate body, and
    a second bore extending into the elongate body from the outlet end along a portion of the length of the elongate body, wherein each opposed end of the reaction region is defined by a shoulder member adapted to substantially preclude a flow of fluid past the shoulder member, the electrode further comprising an inlet aperture is provided in the elongate body at an inlet end of the reaction region, the inlet aperture being in fluid communication with the first bore, and an outlet aperture in the elongate body at an outlet end of the reaction region, the outlet aperture being in fluid communication with the second bore, and wherein the inlet aperture and the outlet aperture are located at least partially within the shoulder member located at the respective end of the reaction region.

23. The electrode according to claim 22 wherein the electrode further comprises a first sealing region located between the reaction region and the inlet end of the elongate body and a second sealing region located between the reaction region and the outlet end of the elongate body, wherein the first sealing region and the second sealing region each comprise a plurality of receiving portions adapted to receive a sealing member therein, and wherein a barrier member adapted to reduce or eliminate the flow of fluid between the receiving portions is provided between each of the plurality of receiving portions.

24. The plasma reactor including an inner electrode, wherein the inner electrode comprises the electrode according to claim 22.

25. A plasma reactor assembly, the assembly comprising one or more plasma reactors as claimed in claim 24 in fluid communication with a source of fluid to be reacted in the one or more plasma reactors, the assembly further comprising an electrical current generation portion adapted to generate an electrical current to drive a reaction in the one or more plasma reactors, and wherein the assembly further comprises one or more valves adapted to reduce or eliminate fluid flow into or out of the assembly.

* * * * *

UNITED STATES PATENT AND TRADEMARK OFFICE
CERTIFICATE OF CORRECTION

| | | |
|---|---|---|
| PATENT NO. | : 11,961,717 B2 | Page 1 of 1 |
| APPLICATION NO. | : 17/415898 | |
| DATED | : April 16, 2024 | |
| INVENTOR(S) | : John Lionel Brauer | |

It is certified that error appears in the above-identified patent and that said Letters Patent is hereby corrected as shown below:

On the Title Page

At Item (54) and in the Specification, Column 1, Line 1, "PLASMA REACTORS" should read --IMPROVEMENTS IN PLASMA REACTORS--

Signed and Sealed this
Twenty-third Day of July, 2024

Katherine Kelly Vidal
*Director of the United States Patent and Trademark Office*